United States Patent [19]

Schmitt-Landsiedel et al.

[11] Patent Number: 4,661,831
[45] Date of Patent: Apr. 28, 1987

[54] INTEGRATED RS FLIP-FLOP CIRCUIT

[75] Inventors: Doris Schmitt-Landsiedel; Gerhard Dorda, both of Munich, Fed. Rep. of Germany

[73] Assignee: Siemens Aktiengesellschaft, Berlin and Munich, Fed. Rep. of Germany

[21] Appl. No.: 633,599

[22] Filed: Jul. 23, 1984

[30] Foreign Application Priority Data

Aug. 19, 1983 [DE] Fed. Rep. of Germany ....... 3330026

[51] Int. Cl.$^4$ ..................... H01L 27/02; H01L 27/12; G11C 11/34
[52] U.S. Cl. ....................................... 357/46; 357/43; 357/4; 357/41; 365/182; 365/177
[58] Field of Search .................... 357/41, 43, 22, 4, 6, 357/46, 16; 365/177, 182, 188

[56] References Cited

U.S. PATENT DOCUMENTS

| | | | |
|---|---|---|---|
| 3,751,723 | 9/1973 | Shien | 357/4 |
| 4,150,392 | 4/1978 | Nonaka | 357/43 |
| 4,516,146 | 3/1985 | Shanon | 357/4 |

OTHER PUBLICATIONS

Möschwitzer, A., et al., Mikroelektronische Schaltkreise, VEB Verlag Technik Berlin, 1979, pp. 118–119.

Heiblum, M., "Tunnelling Hot Electron Transfer Amplifiers (THETA): Amplifiers Operating up to the Infrared", Solid-State Electronics, vol. 24, 1981, pp. 343–366.

*Primary Examiner*—Martin H. Edlow
*Assistant Examiner*—Terri M. Henn
*Attorney, Agent, or Firm*—Hill, Van Santen, Steadman & Simpson

[57] ABSTRACT

An integrated RS flip-flop circuit comprises two cross-coupled inverters which respectively consist of a field effect transistor and a resistor connected in series. Each field effect transistor is connected to an additional logic element whose control input represents the R or the S input, respectively. Realization of a flip-flop circuit on the smallest possible semiconductor is achieved by designing the additional logic elements as hot electron transistors, each of which is combined with one of the field effect transistors to form a common component which assumes two transistor functions but only requires the area of one field effect transistor. The invention is particularly useful in VLSI circuits.

19 Claims, 4 Drawing Figures

INTEGRATED RS FLIP-FLOP CIRCUIT

BACKGROUND OF THE INVENTION

1. Field of the Invention

The present invention relates to a flip-flop circuit, and more particularly to an integrated RS flip-flop circuit comprising two cross-coupled inverters which respectively comprise a field effect transistor and a resistor element connected in series therewith by way of a circuit node, whereby the circuit nodes of each inverter is connected to the gate electrode of the field effect transistor belonging to the other inverter, and in which each field effect transistor is connected to a switching element having a control input which forms the R or, respectively, S input of the flip-flop, and to the use thereof as a semiconductor memory cell.

2. Description of the Prior Art

A flip-flop circuit of the type generally set forth above is known from the book of A. Möschwitzer and G. Jorke entitled "Mikroelektronische Schaltreise", published by VEB Verlag Technik, Berlin 1979, p. 118, FIG. 2.37c. The switching elements are likewise realized as field effect transistors, their source-drain segments being connected parallel to the field effect transistors of the cross-coupled converters and their gate terminals representing the R or, respectively, S input.

SUMMARY OF THE INVENTION

The object of the present invention is to provide an integrated RS flip-flop circuit which can be realized on a significantly smaller semiconductor area than can comparible, traditional circuits.

The above object is achieved, according to the present invention, in a flip-flop circuit of the type set forth above which is characterized in that the switching elements respectively comprise a hot electron transistor of the tunnel emission type which includes an emitter layer, an insulator layer, a base layer and a collector layer. Each hot electron transistor is combined with the field effect transistor assigned thereto such that the emitter layer comprises an inversion layer in the channel region or the field effect transistor, that the base layer represents a first portion of the gate electrode, that the insulator layer is disposed between the base layer and a first portion of the channel region, and that the collector layer, with a portion laterally projecting over the base layer, represents the remaining portion of the gate electrode which covers the remaining portion of the channel region. The collector layer comprises a terminal which is connected to the circuit node of the other inverter and the base layers of the hot electron transistors are respectively connected to the R and S inputs.

An advantage which may be attained in practicing the present invention is that the field effect transistor of each inverter which assumes the switch function and the switching element assigned thereto comprise a single semiconductor component which assumes two transistor functions and only requires the semiconductor area of a single metal-insulator-semiconductor (MIS) field effect transistor for its realization. The switching speed at the R input and the S input is also greatly improved in comparison to traditional circuits.

BRIEF DESCRIPTION OF THE DRAWINGS

Other objects, features and advantages of the invention, its organization, construction and operation will be best understood from the following detailed description, taken in conjunction with the accompanying drawings, in which.

DESCRIPTION OF THE PREFERRED EMBODIMENTS

Figure 1:
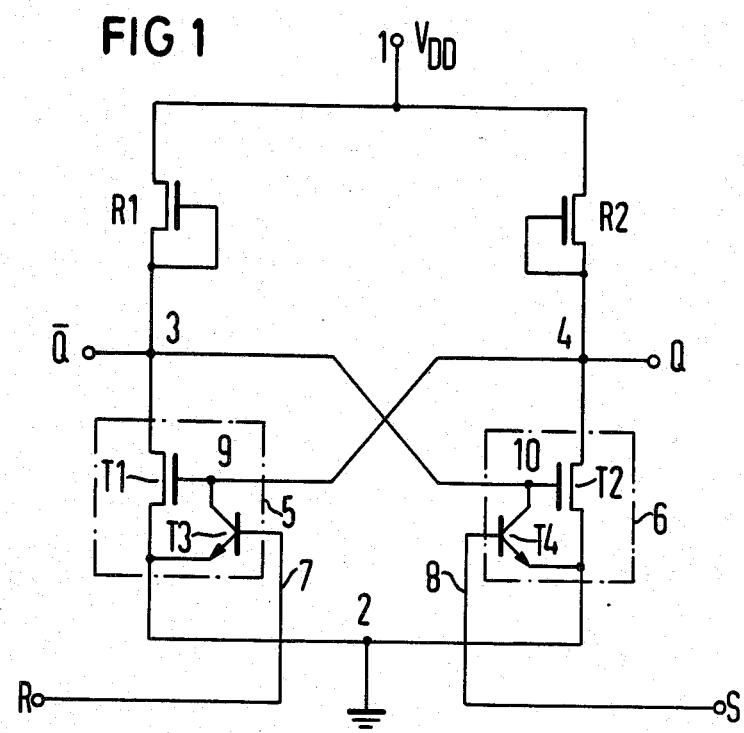
FIG. 1 is a schematic circuit diagram of an integrated RS flip-flop constructed in accordance with the present invention.

Referring to FIG. 1, two cross-coupled inverters are shown as forming a flip-flop circuit. The first inverter comprises the series connection of a field effect transistor T1 and a resistor element R1 connected between a pair of terminals 1 and 2 which are respectively connected to a supply voltage $V_{DD}$ and a reference potential, here ground. The second inverter comprises a field effect transistor T2 and a resistor element R2 which are likewise connected between the terminals 1 and 2. A circuit node 3 is located between the transistor T1 and the resistor element R1 and is connected to the gate of the transistor T2. Likewise, a circuit node 4 is located between the transistor T2 and the resistor element R2 and is connected to the gate of the transistor T1. The resistor elements R1 and R2 are illustrated in FIG. 1 as field effect transistors of the depletion type whose gate electrodes are connected to their source terminals; however, they can also be realized in some other manner, for example as field effect transistors of the enhancement type whose gate electrodes are connected to the drain terminals, as strip-shaped structures of resistance-affected material or the like. Simultaneously, the circuit nodes 4 and 3 respectively represent the Q and $\overline{Q}$ outputs of the flip-flop circuit.

A transistor T3 is a hot electron transistor of the tunnel emission type which is combined with the transistor T1 to form a component 5. A further hot electron transistor T4 is combined with the field effect transistor T2 to form a component 6. The base terminals of the transistors T3 and T4 are thereby provided with leads 7 and 8 which are connected to the R input or, respectively, the S input of the circuit. The collector terminal 9 of the transistor T3 is connected to the circuit node 4 and the collector terminal 10 of the transistor T4 is connected to the circuit node 3. Hot electron transistors are known, for example, from the publication Solid State Electronics, Vol. 24, 1981, pp. 343–366, with particular reference to FIG. 1 of the article.

Figure 2:
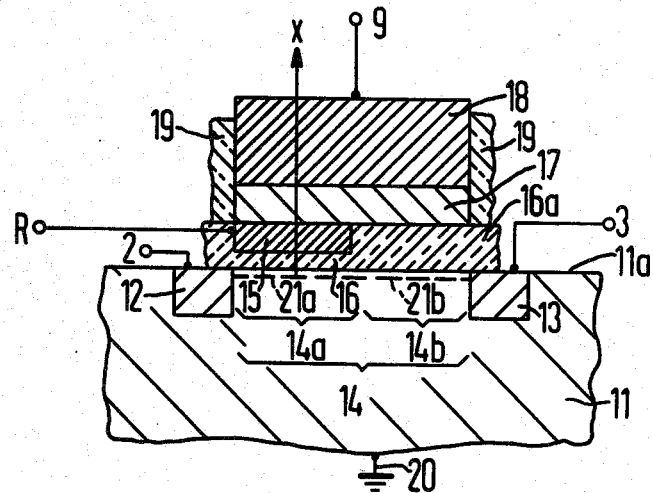
FIG. 2 is a fragmentary cross-section of a component which is schematically illustrated in FIG. 1 and which comprises an MIS field effect transistor and a hot electron transistor.

FIG. 2 illustrates the semiconductor component 5 of FIG. 1 in a fragmentary cross-section view. The component 5 is mounted on a body 11 of doped semiconductor material, for example p-doped silicon having an impurity concentration of about $10^{15}/cm^3$, into which two regions, for example n+ doped regions 12 and 13 are located extending into the body 11 from a boundary surface 11a. These regions represent the source region and the drain region of the field effect transistor T1 whose gate electrode comprises two portions. The first portion is formed by a metallic or, respectively, metallically conductive layer 15 which covers a portion 14a of a channel region 14 between the regions 12 and 13, the layer 15 being positioned adjacent to the region 12. A very thin insulating layer 16 is located between the layer 15 and the boundary surface 11a. The thickness of the insulator layer 16 comprising, for example, $SiO_2$ or $Si_3N_4$ advantageously amounts to about 2–5 nm. The layer 15 advantageously comprises an hmp metal, for example Ta, Ti or Mo or W, or of the silicide of one of these metals, i.e. $TaSi_2$, $TiSi_2$, $MoSi_2$ or $WSi_2$, and can have a thickness of about 10 nm. Located above the layer 15 is a polycrystalline silicon layer 17 having a thickness of about 10–100 nm and preferably having a p-doping which is given, for instance, by doping concentration of $10^{14}$–$10^{15}$/cm$^3$, whereby boron can be employed as the dopant. Located on the layer 17 is a metallic or, respectively, metallically conductive layer 18 whose thickness can be arbitrarily selected, but is advantageously greater than the layer thickness of the layer 17. The layer 18 thereby advantageously comprises one of the metals or silicides that have already been mentioned above in conjunction with the layer 15. The layers 17 and 18 cover the entire channel region 14, whereby that portion of the layer 18 which laterally projects over the layer 15 forms the second portion of the gate electrode and, as such, covers the portion 14b of the channel region 14. An electrically-insulating layer (field oxide layer) covering the surface 11a outside of the elements 12–14 comprises portions 19 laterally adjacent to the layers 17 and 18.

The source region 12 is connected to the terminal 2 and the drain region 13 is connected to the circuit node 3. The semiconductor body 11 is connected with the reference potential at 20. The layer 15, further, is connected to the input R, whereas the layer 18 is provided with a collector terminal 9.

When a voltage which lies above a value referred to as a first threshold voltage is supplied via the input R to that portion of the gate electrode of the field effect transistor T1 consisting of the layer 15, then a depletion zone extending from the boundary surface 11a is formed in the semiconductor body 11 under the layer 15, whereby an inversion layer 21a which forms an n-conductive channel below the layer 15 is built up within the depletion zone directly at the boundary surface 11a. The inversion layer 21a represents the emitter layer of a hot electron transistor (HET) of the tunnel emission type which additionally comprises the layers 15, 16, 17 and 18. The layer 15 thereby forms a metallic or, respectively, metallically-conductive base layer of the HET, whereby the insulator layer 16 is located between the layer 15 and the emitter layer 21a, whereas the polycrystalline silicon layer 17, together with the metallic or, respectively, metallically-conductive layer 18, represents the collector layer of the HET. A collector voltage which consists of the voltage at the circuit node 4 in FIG. 1 is supplied to the layer 18 via the terminal 9. When this voltage exceeds a second threshold voltage, which is assigned to the portion 14b of the channel region 14, then an inversion layer 21b is formed below that portion of the layer 18 which laterally projects over the layer 15, the inversion layer 21b forming an n-conductive channel between the regions 12 and 13 together with the inversion layer 21a. The fact that a portion 16a of the insulator layer 16 which, at, for example, 15 nm is significantly thicker than the remaining portions of the layer, is located between the second portion of the electrode formed by the layer 18 and the portion 14b of the channel region 14 is a co-determining factor for the fact that the second threshold voltage is higher than the first threshold voltage. The depletion zone and the inversion layer 21a below the layer 15 are also built up when a voltage exceeding a second threshold voltage is applied to the terminal 9 given a voltage-free terminal R.

Figure 3:
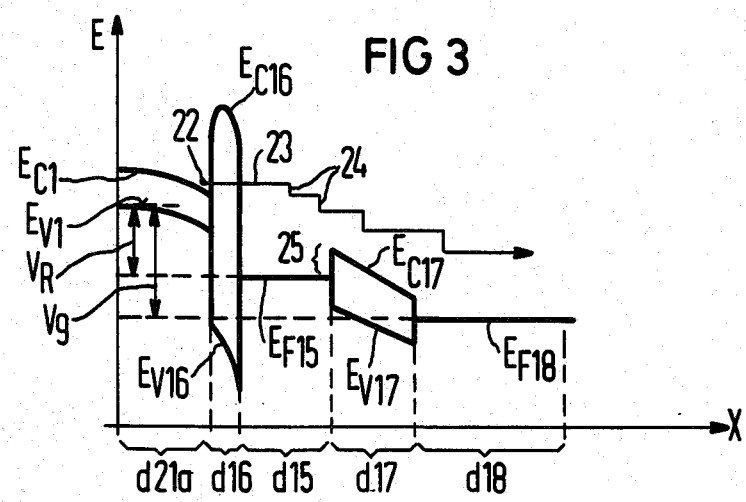
FIG. 3 is a graphic illustration showing a band structure diagram to aid in the explanation of the structure of FIG. 2.

Referring now to the band structure diagram of FIG. 3, the function of the HET will be explained. FIG. 3 illustrates the energy states E entered in the direction of the vertical axis which appears as a function of different distances x from the inversion layer or, respectively, emitter layer 21a. These distances are entered on the axis x which penetrates the layers of the HET in the vertical direction in FIG. 2, i.e. perpendicular to the boundary surface 11. Successive segments of the x-axis are assigned to the layers 21a, 16, 15, 17 and 18, whereby the lengths d21a, d16, d15, d17 and d18 of these segments differ from the actual layer thicknesses D21a, D16, D15, D17 and D18 of the layers 21a, 16, 15, 17 and 18 for reasons of clarity in illustration. Therefore, the segment d16 greatly elongated in comparison to the sequence d15, d17, d18 and d21a. The upper limit of the valence band of the semiconductor material of the body 11 is referenced $E_{v1}$ in the segment 21a assigned to the inversion layer 21a, whereas $E_{c1}$ represents the energy level of the electrons within the inversion layers 21a. In the segment d16, the upper line $E_{c16}$ represents the lower limit of the conduction band of the insulator layer 16, whereas the lower line $E_{v16}$ denotes the upper limit of the valence band. The respective fermi levels $E_{F15}$ and $E_{F18}$ are entered in the segments d15 and d18, whereas the lower limit of the conduction band of the layer 17 is illustrated by the line $E_{c17}$ in the segment d17 and the upper limit of the valence band is illustrated by the line $E_{v17}$.

Given a sufficiently low thickness d16 of the insulator layer 16, electrons proceed from the inversion layer 21a, these being identified in FIG. 3 according to their energy level, for example by the point 22, and through the insulator layer 16 into the base layer 15 as a consequence of the tunnel effect, as indicated by the horizontal straight line 23. These electrons lose energy due to scatter at voids and at the crystal lattice of the layer 15, this being expressed by the step-shaped curve 24. When the energy of these electrons is subsequently high enough that they can overcome the energy threshold 25 at the boundary surface between the layers 15 and 17, they proceed into the collector layer of the HET consisting of the layers 17 and 18. The magnitudes of the voltages applied via the terminals R and 9 with respect to the reference potential are referenced $V_R$ and $V_9$ in FIG. 3.

The semiconductor component 6 is constructed analogous to the component 5 and, in accordance with FIG. 1, is provided with the terminal 2, 4, 10 and S.

When the RS flip-flop according to FIG. 1 is in its set switch position (T1 conductive, T2 inhibited), then a voltage corresponding to a logical "1" and which corresponds roughly to the supply voltage $V_{DD}$ can be tapped at the output Q, whereas the output $\overline{Q}$ lies at about reference potential, this corresponding to a logical "0". The voltage which may be tapped at the output Q or, respectively, at the circuit node 4 is thereby also at the collector terminal 9 of the component 5. This voltage is sufficiently high that both the first threshold voltage of the element 14a and the second threshold voltage of the element 14b are exceeded at the transistor T1 and the inversion layers 21a and 21b form a conductive channel between the regions 12 and 13. On the other hand, the voltage appearing at the circuit node 3 in this switch condition is so low that two threshold voltages of the transistor T2 are downwardly transgressed so that the transistor T2 is inhibited. When a voltage pulse which positively biases the base layer 15 relative to the inversion layer 21a of the transistor T1 is now supplied to the input R, electrons proceed from the layer 21a as a consequence of the tunnel effect, proceeding through the insulated layer 16 into the base layer 15 and continuing to the collector layer 18. As a result thereof, a current flows in the circuit branch 1, R2, 4, 9, T3 and 2, the current producing a voltage drop at the resistor element R2. The voltage at the circuit node 3 rises nearly to the value of the supply voltage $V_{DD}$ as a consequence, so that a gate voltage of such magnitude is supplied to the transistor T2 via the terminal 10 that the inversion layers 21a and 21b of the transistor T2 are built up and the transistor T2 proceeds into its current-conducting condition. Therewith, however, the flip-flop circuit is in its reset condition. The emitter-base circuit of the HET transistor T3 becomes free of current after the cut-out of the voltage pulse at the input R and the downward transgression of the first threshold voltage connected therewith.

When the input S is charged with a pulse in the set condition of the flip-flop, there is no influence on the inhibited condition of the HET transistor T4 because the same is not supplied with an adequate collector voltage via the terminal 10 to the conductive transistor T1.

In the reset condition of the flip-flop (T2 conductive, T1 inhibited), analogous switch events sequence in the current branch 1, R1, 3, 10, T4 and 2 when a pulse is supplied to the input S, the voltage at the node 3 being lowered, the transistor T2 inhibited, the transistor T1 conductive and the flip-flop thus proceeding into its second condition by way of the aforementioned switch events.

The manufacture of the semiconductor component according to FIG. 2 initially corresponds to the traditional manufacture of a field effect transistor. After a field oxide layer 19, which covers the semiconductor body 11 over the entire surface, has been etched off above the channel region 14 and above the regions 12 and 13 and after an insulator layer having a thickness of, for example, 15 nm, this roughly corresponding to the thickness of the portion 16a in FIG. 2, has been grown in the etched region, an intermediate mask whose opening leaves only the region of the metallically conductive layer 15 free is applied to the insulator layer. The insulator layer is etched down to a thickness of about 2-5 nm in this region, for example by way of an etching agent on a fluorine/hydrogen basis, this being indicated in FIG. 2 by the reduced thickness of the layer 16. The layer 15 is then applied using the same intermediate mask. After the removal of the intermediate mask, a further mask which contains an opening which defines the lateral dimensions of the layers 7 and 18 is applied. The layers 17 and 18 are then successively applied upon utilization of this mask. The layer 17 is thereby provided with a p-doping whose concentration amounts to $10^{14}$–$10^{15}$/cm$^3$ before the layer 18 is applied. The removal of the mask is followed by an implantation of a dopant for generating the regions 12 and 13, whereby the layers 15, 17 and 18 as well as the field oxide layer serve as portions of a doping mask (self-adjustment). After the application of the leads which extend to the circuit points 2 and 3 and which contact the elements 12 and 13 through contact holes in the insulator layer 16, the portions of the field oxide layer that were previously etched away above the regions 12 and 13 are built up again to such degree that the field oxide layer extends up to the lateral limiting surfaces of the layers 15, 17 and 18, as indicated in FIG. 2 by the portions 19. A lead extending to the terminal 9 is then applied.

According to another preferred embodiment of the invention, the semiconductor component 5 or, respectively, 6 is constructed on a body 11 consisting of a p-doped III-V semiconductor compound, for example GaAs having a doping concentration of, for example, $10^{16}$/cm$^3$, whereby the insulator layer 16 advantageously comprises AlGaAs. A layer of p-doped GaAs with Be as a dopant replaces the polycrystalline silicon layer 17, whereas the layer 15 is preferably formed by a highly-doped, n-conductive III-V semiconductor compound, for example GaAs, with Si as a dopant, this behaving similar to a metal with respect to its electrical conductivity given a doping concentration of about $10^{18}$/cm$^3$. The layer 18 thereby also advantageously comprises the same material as the layer 15.

Given another embodiment of the invention, the semiconductor component 5 or, respectively, 6 is designed such that a second insulator layer replaces the previously described layer 17, the second insulator layer preferably corresponding to the insulator layer 16 in terms of its structure and its thickness. When a semiconductor body 11 of p-doped silicon is provided, the second insulator layer comprises $SiO_2$ or $Si_3N_4$, and it comprises AlGaAs given a semiconductor body of GaAs. Its thickness advantageously amounts to about 2-5 nm.

Figure 4:
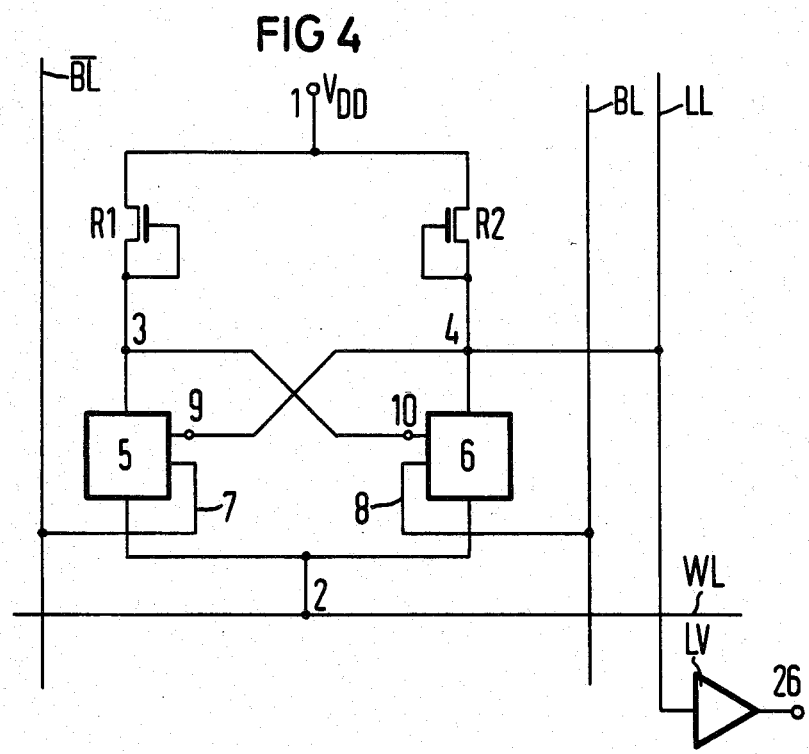
FIG. 4 is a schematic circuit diagram of an RS flip-flop of the present invention as employed as a static storage cell.

FIG. 4 illustrates the use of a flip-flop circuit constructed in accordance with the present invention as a static storage cell. The circuit illustrated in FIG. 2 has thereby been augmented insofar as the terminal 2 is connected to a work line WL which serves for addressing the storge cell, whereas the conductors 8 and 7 are connected to respective bit lines BL and $\overline{BL}$, the latter carrying a signal which is respectively inverted relative to that on the bit line BL. The circuit node 4 (or the circuit node 3), finally, is connected to a read line LL. A multitude of such storage cells are usually disposed next to and above one another in a plurality of rows and columns, whereby the storage cells lying in one row are adjacent to the same work line WL, whereas all storage cells located in one column are connected to the same bit lines and the same read line. The read line LL is connected to the input of a read amplifier L having an output 26 for providing the read memory signal.

In the quiescent condition, the word line WL lies at a potential $V_x$ which corresponds to a logical "1" on the line BL or the line $\overline{BL}$ or exceeds this or is smaller than such a "1" by less than the value of the first threshold voltage of the transistor T1 or the transistor T2. Achieved as a result thereof is that the transistors T3 and T4 are not influenced given appearance of a "1" signal on the bit line BL or the bit line $\overline{BL}$ which is to be written into a storage cell connected at the same bit lines and which has been selected via its word line. A storage cell lying thereat is only selected and, therefore, addressable when the potential at the work line WL has been lowered to about the reference potential. When this cell is located in its reset condition (T2 conductive, T1 inhibited), then it is switched into its set condition by a "1" on the bit line BL, the "1" being thereby written into the cell. A logical "0" is fed in by supplying a corresponding signal via the bit line $\overline{BL}$. After write-in, the potential on the word line WL is again increased to the value $V_x$ so that the stored signal cannot be unintentionally canceled or, respectively, overwritten.

The read-out of the respectively stored signal then occurs via the line LL after the potential of the word line WL has been lowered to about the reference potential, whereby the input of the read amplifier LV is occupied with a signal given read-out of a "1" but is not so supplied given read-out of the "0".

The "1" signals on the bit lines BL and $\overline{BL}$ must be greater by the amount of the base-emitter voltage $V_R$ (FIG. 3) than the potential to which the word line WL is lowered given selection of the cell.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In an integrated RS flip-flop circuit of the type in which a pair of cross-coupled inverters respectively comprise a resistor element and a field effect transistor having a gate and a source-drain segment connected in series with the resistor element between a supply terminal and a reference terminal, in which each field effect transistor has a gate cross-connected to the junction of the other field effect transistor and its series-connected resistor element, and in which a pair of switching elements are respectively connected to the field effect transistors and include control inputs constituting an R input and an S input, the improvement wherein:

each of said switching elements comprises a tunnel emission hot electron transistor comprising a base, an emitter, and a collector;

each of said field effect transistors comprises a doped semiconductor body of a first conductivity type including a boundary surface and being connected to a reference potential, a pair of doped first regions of a second conductivity type opposite said first conductivity type spaced apart and extending from said boundary surface into said body and defining a channel region in said body therebetween and constituting a source and a drain, an insulator carried on said boundary surface over said channel region, and a gate layer structure provided on said insulator; and each of said hot electron transistors comprises an inversion layer in said channel abutting one of said first regions and constituting said emitter, a conductive layer carried on said insulator extending over said emitter and constituting said base, and a portion of said gate layer structure extending over said base and constituting said collector.

2. The improved integrated RS flip-flop circuit of claim 1, wherein:

each of said field effect transistors is a depletion type field effect transistor.

3. The improved integrated RS flip-flop circuit of claim 1, wherein:

said conductive layer comprises a metal selected from the group of high melting point metals consisting of Ta,Ti, Mo and W.

4. The improved integrated RS flip-flop circuit of claim 1, wherein:

said conductive layer comprises a silicide of metal selected from the group of hmp metals consisting of Ta, Ti, Mo and W.

5. The improved integrated RS flip-flop circuit of claim 1, wherein:

said conductive layer comprises a highly doped III-V semiconductor compound.

6. The improved integrated RS flip-flop circuit of claim 5, wherein:

said semiconductor compound is GaAs.

7. The improved integrated RS flip-flop circuit of claim 6, wherein:

said GaAs semiconductor compound is an n-doped compound.

8. The improved integrated RS flip-flop circuit of claim 1, wherein:

said gate layer structure comprises a gate; and said collector further comprises a polycrystalline silicon layer carrying said gate.

9. The improved integrated RS flip-flop circuit of claim 1, wherein:

said gate layer structure comprises a gate; and said collector further comprises a p-doped GaAs layer carrying said gate.

10. The improved integrated RS flip-flop circuit of claim 1, wherein:

said gate layer structure comprises a III-V semiconductor compound layer as said collector and a metal layer as said gate.

11. The improved integrated RS flip-flop circuit of claim 1, wherein:

said gate layer structure comprises a III-V semiconductor compound layer as said collector and a metallically-conductive layer as said gate.

12. The improved integrated RS flip-flop circuit of claim 1, wherein:

said gate layer structure comprises a second insulator carried on said first insulator and a metal layer carried on said second insulator.

13. The improved integrated RS flip-flop circuit of claim 12, wherein:

said metal layer comprises a metal selected from the group of hmp metals consisting of Ta,Ti, Mo and W.

14. The improved integrated RS flip-flop circuit of claim 12, wherein:

said metal layer comprises a III-V highly doped semiconductor compound.

15. The improved integrated RS flip-flop circuit of claim 12, wherein:

said metal layer comprises a highly n-doped GaAs compound

16. The improved integrated RS flip-flop circuit of claim 12, wherein:

said metal layer comprises a scilicide of metal selected from the group of hmp metals consisting of Ta, Ti, Mo and W.

17. The improved integrated RS flip-flop circuit of claim 1, wherein:

said gate layer structure comprises a metal layer and a second insulator carried by said first insulator and carrying said metal layer, said second insulator having a thickness in the range of 2-5 nm.

18. The improved integrated RS flip-flop circuit of claim 1, in combination with:
- a pair of bit lines each connected to a respective base;
- a word line connected to said field effect transistors on the sides opposite said junctions;
- a read line connected to one of said junctions; and
- a read amplifier connected to said read line.

19. A switch component comprising:
- a field effect transistor including a doped semiconductor body of a first conductivity type and including a boundary surface and adapted for connection to a reference potential, a pair of doped regions of a second conductivity type opposite that of said first conductivity type extending, spaced apart, from said boundary surface into said body and constituting a source and a drain and defiing a channel region therebetween, an insulator covering at least said channel region, and a gate structure carried on said insulator; and
- a tunnel emission type hot electron transistor comprising a conductive layer as a base carried on said insulator and covering a portion of said channel region, an inversion channel in said channel region below said conductive layer and contacting one of said first regions as an emitter, and a portion of said gate structure constituting a collector.

* * * * *